United States Patent
Xu

(10) Patent No.: US 10,923,002 B1
(45) Date of Patent: Feb. 16, 2021

(54) FLEXIBLE DISPLAY DEVICE

(71) Applicant: Wuhan China Star Optoelectronics Semiconductor Display Technology Co., Ltd., Wuhan (CN)

(72) Inventor: Feng Xu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/642,021

(22) PCT Filed: Nov. 19, 2019

(86) PCT No.: PCT/CN2019/119322
§ 371 (c)(1),
(2) Date: Feb. 26, 2020

(30) Foreign Application Priority Data

Aug. 29, 2019 (CN) .......................... 201910812713.0

(51) Int. Cl.
*G09G 5/00* (2006.01)
*G09F 9/30* (2006.01)
*H01L 27/32* (2006.01)
*G06F 3/041* (2006.01)
*H01L 51/52* (2006.01)

(52) U.S. Cl.
CPC ............ *G09F 9/301* (2013.01); *G06F 3/0412* (2013.01); *H01L 27/323* (2013.01); *H01L 51/5293* (2013.01); *H01L 2251/5338* (2013.01)

(58) Field of Classification Search
CPC ..... G09F 9/301; G06F 3/0412; H01L 27/323; H01L 51/5293; H01L 2251/5338
See application file for complete search history.

(56) References Cited

U.S. PATENT DOCUMENTS

| | | | | |
|---|---|---|---|---|
| 2010/0253874 A1* | 10/2010 | Ito | ...................... | G02F 1/133308 349/58 |
| 2012/0212890 A1* | 8/2012 | Hoshino | ............. | H04M 1/0202 361/679.01 |
| 2013/0027629 A1* | 1/2013 | Kiyohara | .......... | G02F 1/133308 349/58 |
| 2013/0076696 A1* | 3/2013 | Shin | ....................... | G06F 3/0428 345/175 |
| 2014/0009914 A1* | 1/2014 | Cho | ........................ | G09F 9/301 362/97.3 |

(Continued)

FOREIGN PATENT DOCUMENTS

| CN | 203644006 | 6/2014 |
|---|---|---|
| CN | 108020944 | 5/2018 |

(Continued)

*Primary Examiner* — Joe H Cheng

(57) ABSTRACT

The present disclosure provides a flexible display device including a display panel, a first attachment frame, a second attachment frame, and a cover window structure, wherein the cover window structure is connected to the display panel through the first attachment frame. By providing a replaceable cover window structure, thinning of the cover window structure can be realized to the greatest extent, and its bending performance can be improved. As such, a wider choice of materials is available, and expensive materials can be replaced by cheaper layers, such that the production of the hardened layer can be achieved through various process routes.

18 Claims, 2 Drawing Sheets

(56) References Cited

U.S. PATENT DOCUMENTS

| | | | | |
|---|---|---|---|---|
| 2014/0133073 A1* | 5/2014 | Ahn | ................. | G02F 1/133308 |
| | | | | 361/679.01 |
| 2014/0240619 A1* | 8/2014 | Yokohama | ............ | G06F 3/0445 |
| | | | | 349/12 |
| 2014/0307474 A1* | 10/2014 | Kim | .................... | G02B 6/0093 |
| | | | | 362/613 |
| 2014/0376162 A1* | 12/2014 | Lim | ........................ | G09F 9/33 |
| | | | | 361/679.01 |
| 2016/0120043 A1* | 4/2016 | Kim | .................... | B32B 27/302 |
| | | | | 362/97.1 |
| 2016/0306451 A1* | 10/2016 | Isoda | ................... | B32B 27/325 |
| 2018/0117876 A1 | 5/2018 | Sohn et al. | | |
| 2018/0150179 A1* | 5/2018 | Moon | ................ | G06F 3/04166 |
| 2018/0153038 A1* | 5/2018 | Kim | .................... | H05K 5/0017 |
| 2019/0152831 A1* | 5/2019 | An | ...................... | B32B 38/1866 |
| 2019/0179139 A1* | 6/2019 | Oh | ........................ | B32B 27/36 |

FOREIGN PATENT DOCUMENTS

| | | | |
|---|---|---|---|
| CN | 109445645 | | 3/2019 |
| CN | 109445645 A | * | 3/2019 |
| CN | 109508121 | | 3/2019 |
| CN | 109508121 A | * | 3/2019 |
| CN | 110058731 | | 7/2019 |
| CN | 110058731 A | * | 7/2019 |
| KR | 2019-0043349 | | 4/2019 |

* cited by examiner

FLEXIBLE DISPLAY DEVICE

RELATED APPLICATIONS

This application is a National Phase of PCT Patent Application No. PCT/CN2019/119322 having International filing date of Nov. 19, 2019, which claims the benefit of priority of Chinese Patent Application No. 201910812713.0 filed on Aug. 29, 2019. The contents of the above applications are all incorporated by reference as if fully set forth herein in their entirety.

FIELD AND BACKGROUND OF THE INVENTION

The present disclosure relates to a field of display technology, and in particular, to a flexible display device.

In recent years, flexible displays have become more and more popular and are likely to become the dominant next-generation display technology.

In development of flexible display technology, the structural design of the cover window structure is very important. Generally, the cover window (CW) structure is used as the outermost protective layer of the entire display. The CW has a double-layered structure, which is constituted by applying a hardened material having a higher strength on a colorless polyimide (CPI)-based material with a certain thickness. However, it encounters the following problems. On one hand, the CPI-based material and the hardened material are expensive, and coating the hardened material on the CPI-based material also involves complex processes, such that the use of the CPI as the base material cannot exert good performance of the material itself. On the other hand, even if the CPI is used as the base material, the overall strength of the CW is still low.

The replacement materials of CPI materials are also subject to more restrictions. It is necessary to solve both the strength and bending performance issues. In terms of bending performance, thinning is a powerful means to improve the bending performance of CW. However, for a stacked structure, thinning the structure is very difficult.

In summary, there is a need to provide a new flexible display device to solve the above technical problems.

SUMMARY OF THE INVENTION

The present disclosure provides a flexible display device, which solves the technical problem that the base material used in the cover window structure of the existing flexible display device is expensive, the process is complicated, and the bending performance of the cover window structure cannot meet the requirements because the stacked structure is not easy to thin.

In order to solve the above problems, the technical solutions provided by this disclosure are as follows:

An embodiment of the present disclosure provides a flexible display device, including:

a display panel having a front side and a back side opposite to each other;

an attachment frame including a first attachment frame disposed on a peripheral edge of the front side of the display panel; and a cover window structure fixedly disposed on a side of the first attachment frame away from the display panel, and connected to the display panel through the first attachment frame, wherein the cover window structure, the display panel, and the first attachment frame enclose a cavity therebetween.

According to the flexible display device provided in an embodiment of the present disclosure, the cover window structure includes a base layer, and the base layer is made of a material including at least one of a cycloolefin polymer and a polyterephthalate plastic.

According to the flexible display device provided in an embodiment of the present disclosure, the cover window structure further includes a hardened layer disposed on the base layer.

According to the flexible display device provided in an embodiment of the present disclosure, a light adjustment layer is provided on the front side of the display panel, and the light adjustment layer is located in the cavity.

According to the flexible display device provided in an embodiment of the present disclosure, the cover window structure and the first attachment frame are fixedly connected by bonding with as adhesive layer or by mechanical connection.

According to the flexible display device provided in an embodiment of the present disclosure, the cover window structure and the first attachment frame are fixedly connected by rivet fixing or screw connection.

According to the flexible display device provided in an embodiment of the present disclosure, a touch panel and a polarizer are stacked in order from bottom to top between the display panel and the first attachment frame, a first adhesive layer is disposed between the display panel and the touch panel, and a second adhesive layer is disposed between the touch panel and the polarizer.

According to the flexible display device provided in an embodiment of the present disclosure, the attachment frame further includes a second attachment frame, the second attachment frame is disposed on a peripheral edge of the back side of the display panel to fix the display panel, and the second attachment frame and the display panel are fixedly connected by bonding with an adhesive layer.

According to the flexible display device provided in an embodiment of the present disclosure, a back plate is provided between the display panel and the second attachment frame, a foam layer is provided on a side of the back plate away from the display panel, and a third adhesive layer is provided between the display panel and the back plate.

According to the flexible display device provided in an embodiment of the present disclosure, the flexible display device further includes an entire device frame, and outer sides of the first attachment frame and second attachment frame are attached to an inner surface of the entire device frame.

According to the flexible display device provided in an embodiment of the present disclosure, the first attachment frame and the second attachment frame are integrally formed with the entire device frame.

Beneficial effects of the present disclosure are that the flexible display device provided by the present disclosure realizes thinning of the cover window structure to the greatest extent by providing a replaceable cover window structure, and improves its bending performance, and realizes thinning of other functional layers. As such, a wider choice of materials is available, and expensive materials can be replaced by cheaper layers, such that the production of the hardened layer can be achieved through various process routes, with strong replaceability, simple processes, and lower production costs.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

Figure 1:
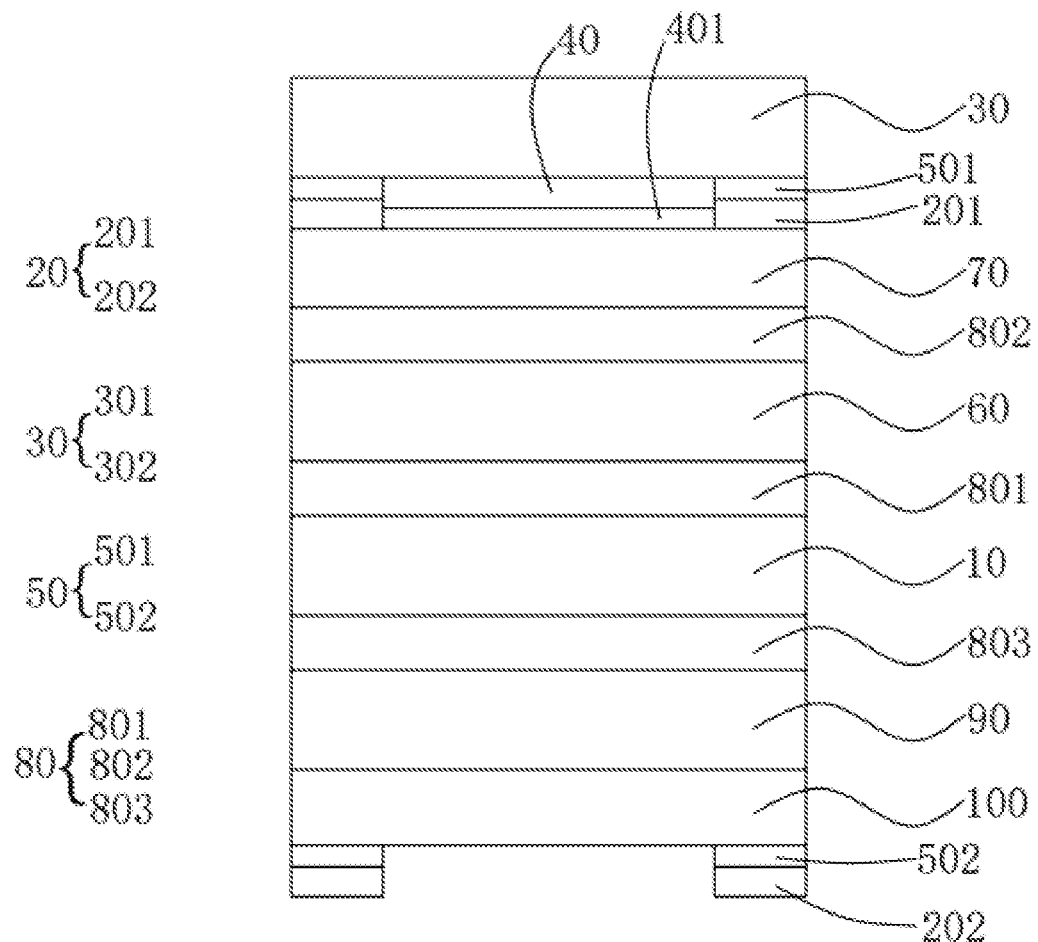
FIG. 1 is a schematic cross-sectional structure diagram of a flexible display device according to an embodiment of the present disclosure.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

The present disclosure can solve the technical problem that the base material used in the cover window structure of the existing flexible display device is expensive, the process is complicated, and the bending performance of the cover window structure cannot meet the requirements because the stacked structure is not easy to thin.

As shown in FIG. 1, the flexible display device provided by the present disclosure includes a display panel 10, an attachment frame 20, and a cover window structure 30 for protecting the display panel 10. The display panel 10 is an organic light emitting diode (OLED) display panel, and has a front side and a back side opposite to each other.

The attachment frame 20 includes a first attachment frame 201, wherein the first attachment frame 201 is disposed on a peripheral edge of the front side of the display panel 10, and an outer side of the first attachment frame 201 is flush with outside of the display panel 10. Generally, the first attachment frame 201 has a rectangular ring shape.

The cover window structure 30 is fixed on a side of the first attachment frame 201 away from the display panel 10 and has a shape corresponding to the shape of the display panel 10. The cover window structure 30 and the display panel 10 are connected by the first attachment frame 201. Since the first attachment frame 201 has a rectangular ring shape, the cover window structure 30, the display panel 10, and the first attachment frame 201 enclose a cavity 40 therebetween.

The cover window structure 30 and the first attachment frame 201 may be fixedly connected by bonding with an adhesive layer. A first adhesive layer 201 is provided between the cover window structure 30 and the first attachment frame 201, wherein the first adhesive layer 501 may be formed of a double-sided adhesive tape.

Preferably, the cover window structure 30 and the first attachment frame 201 are fixedly connected by mechanical connection, such as rivet fixing and screw connection, so as to provide a better fixing performance therebetween.

Since the cover window structure 30 provided in the embodiment of the present disclosure is independently fixed on the first attachment frame 201, it is beneficial for the cover window structure 30 to be produced as an independent replaceable standard accessory. When the cover window structure 30 is damaged in use, it can be replaced by a new cover window structure 30 instead of replacing the entire flexible display device, and the requirements for the strength performance and bending performance of the cover window structure 30 can be appropriately reduced, thereby reducing production costs.

Specifically, the first attachment frame 201 has a width of 0.1 mm-20 mm, and a thickness of 0.05 mm-5 mm.

Figure 2:
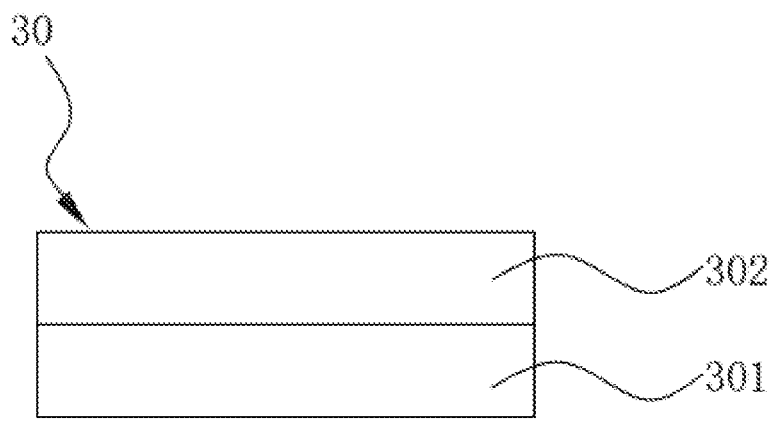
FIG. 2 is a schematic cross-sectional structure diagram of a cover window structure of a flexible display device according to an embodiment of the disclosure.

As shown in FIG. 2, the cover window structure 30 includes a base layer 301. The base layer 301 is made of a material selecting from at least one of cyclic olefins polymer (COP) and polyethylene terephthalate (PET), and the base layer 301 using such a material has relatively high surface strength. Compared to the CPI material used as the base material in the prior art, the base layer 301 of the cover window structure 30 has a wider choices of materials, and of course, the material of the base layer 301 can also be selected from other types of materials, and the embodiment of the present disclosure should not be particularly limited thereto.

The cover window structure further includes a hardened layer 302 disposed on the base layer 301, which can ensure the bendability, hardness, and impact resistance of the cover window structure 30. The hardened layer 302 is made of a material including an organic material or an inorganic material. For example, the material of the hardened layer 302 may be acryl, silane, urethane, or epoxy. The hardened layer 302 is prepared on the base layer 301 by sputtering or coating. Compared with the preparation process of the hardened layer 302 in the prior art, the hardened layer 302 for the cover window structure 30 provided in an embodiment of the present disclosure can produced by various process routes.

Specifically, the thickness of the cover window structure 30 is 0.05 mm-0.1 mm. Compared with the prior art, the cover window structure 30 provided in an embodiment of the present disclosure is independent of the stacked structure of the flexible display panel. On one hand, the thinning of the cover window structure 30 is relatively easy to implement, that is, the thinning of the cover window structure 30 can be realized to the greatest extent, and its bending performance is improved; on the other hand, it is also beneficial to realize the thinning of other functional layers of the flexible display device, thus improving the bending performance of the entire flexible display device.

In addition, the bending thickness of the flexible display device is equivalent to the thickness of the cover window structure 30, which is 0.05 mm-0.1 mm, while the cover window structure 30 in the prior art is fixed to the entire structure of the flexible display device, thus its bending thickness of the display device is equivalent to the thickness of its entire structure, which is 0.5 mm-1 mm. Therefore, it can be seen that the bending thickness of the flexible display device provided by an embodiment of the present disclosure is greatly reduced compared with that of the prior art, so that the bending performance is improved.

A light adjustment layer 401 is further provided on the front side of the display panel 10 to adjust light. The light adjustment layer 401 is located in the cavity 40 enclosed by the cover window structure 30, the display panel 10, and the first attachment frame 201.

In addition, the flexible display device may further include an adhesive layer 80 and functional layers such as a touch panel 60 and a polarizer 70, which are stacked between the display panel 10 and the first attachment frame 201 sequentially from bottom to top, wherein the touch panel 60 is attached to the display panel 10 through a first adhesive layer 801 provided between the display panel 10 and the touch panel 60, the polarizer 70 is attached to the touch panel 60 through a second adhesive layer 802 disposed between the touch panel 60 and the polarizer 70, and the polarizer 70 can suppress reflection of external light to improve visibility of the flexible display device.

Further, the attachment frame 20 further includes a second attachment frame 202, which is located at a peripheral edge of the back side of the display panel 10 to fix the display panel 10 and other functional layers, wherein the shape and connection manner of the second attachment frame 202 are similar to those of the first attachment frame 201. For example, the second attachment frame 202 may have a rectangular ring shape, the second attachment frame 202 is fixedly connected to the display panel 10 by bonding with an adhesive layer, and a second adhesive layer 502 is provided between the second attachment frame 202 and the display panel 10. The second adhesive layer 502 may be formed of a double-sided adhesive tape.

In addition, the flexible display device may further include a back plate 90 disposed between the display panel 10 and the second attachment frame 202, wherein the back plate 90 is attached to the display panel 10 through a third adhesive layer 80 provided between the display panel 10 and the back plate 90, and a foam layer 100 is provided on a side of the back plate 90 away from the display panel 10, to play a supporting and buffering role on the display panel 10.

A distance between the first attachment frame 201 and the second attachment frame 202 is slightly larger than a thickness from the polarizer 70 to the back plate 90, which ensures a sufficient space between the first attachment frame 201 and the second attachment frames 202 to place the display panel 10 and other functional layers.

The first attachment frame 201 and the second attachment frame 202 may be made of metals, alloys, or organic materials, to ensure sufficient support strength.

The first adhesive layer 801, the second adhesive layer 802, and the third adhesive layer 803 are optically clear adhesive (OCA) layers.

Figure 3:
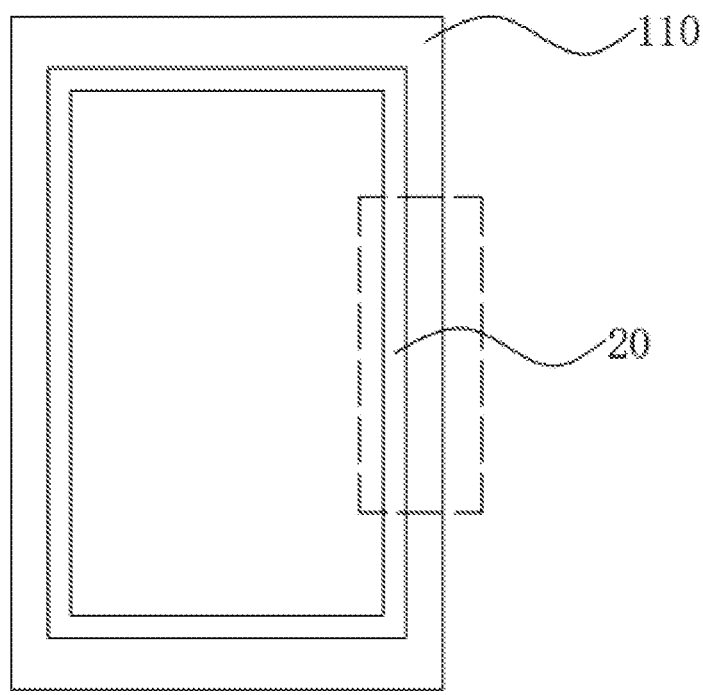
FIG. 3 is a schematic plan view of a flexible display device according to an embodiment of the disclosure.
Figure 4:
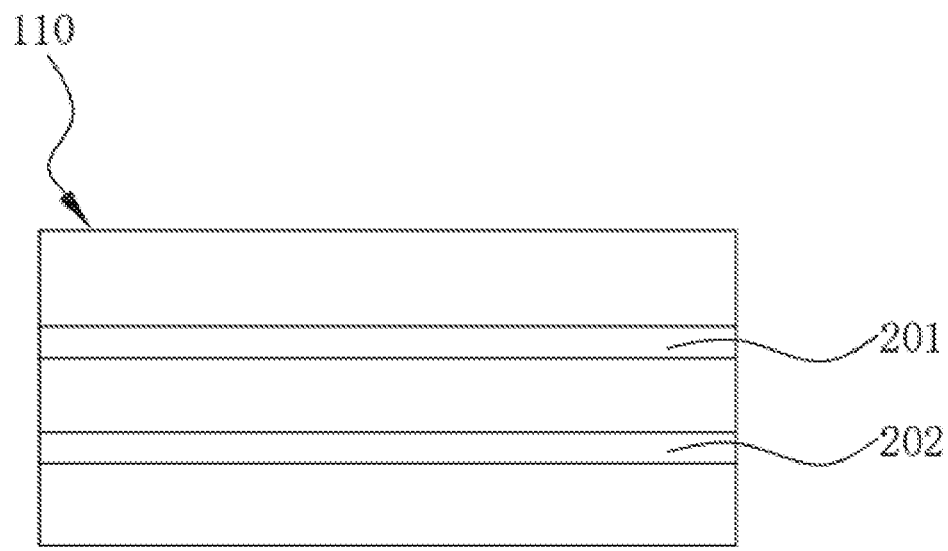
FIG. 4 is a schematic cross-sectional structure diagram of a partial area of the flexible display device in FIG. 3.

As shown in FIG. 3 and FIG. 4, the flexible display device further includes an entire device frame 110 for fixing and protecting the entire structure of the flexible display device to prevent damage. A size of the entire device frame 110 is larger than that of the flexible display device, outer sides of the first attachment frame 110 and second attachment frame 202 are attached to an inner surface of the entire device frame 110, and the first attachment frame is located above the second attachment frame.

It should be noted that the first attachment frame 201, the second attachment frame 202, and the entire device frame 110 may be independent structures, and alternatively, the first attachment frame 201, the second attachment frame 202, and the entire device frame 110 may also be an integrally formed structure, which are formed by an integral molding process.

The material of the entire device frame 110 is the same as those of the first attachment frame 201 and the second attachment frame 202.

Beneficial effects of the present disclosure are that the flexible display device provided by the present disclosure realizes thinning of the cover window structure to the greatest extent by providing a replaceable cover window structure, and improves its bending performance, and realizes thinning of other functional layers. As such, a wider choice of materials is available, and expensive materials can be replaced by cheaper layers, such that the production of the hardened layer can be achieved through various process routes, with strong replaceability, simple processes, and lower production costs.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A flexible display device, comprising:
   a display panel having a front side and a back side opposite to each other;
   an attachment frame comprising a first attachment frame disposed on a peripheral edge of the front side of the display panel, wherein the first attachment frame has a rectangular ring shape; and
   a cover window structure fixedly disposed on a side of the first attachment frame away from the display panel, and connected to the display panel through the first attachment frame, wherein the cover window structure, the display panel, and the first attachment frame enclose a cavity therebetween, wherein a touch panel and a polarizer are stacked in order from bottom to top between the display panel and the first attachment frame, a first adhesive layer is disposed between the display panel and the touch panel, and a second adhesive layer is disposed between the touch panel and the polarizer.

2. The flexible display device according to claim 1, wherein the cover window structure comprises a base layer, and the base layer is made of a material comprising at least one of a cycloolefin polymer and a polyterephthalate plastic.

3. The flexible display device according to claim 2, wherein the cover window structure further comprises a hardened layer disposed on the base layer.

4. The flexible display device according to claim 1, wherein the attachment frame further comprises a second attachment frame, the second attachment frame is disposed on a peripheral edge of the back side of the display panel to fix the display panel, and the second attachment frame and the display panel are fixedly connected by bonding with an adhesive layer.

5. The flexible display device according to claim 4, wherein a back plate is provided between the display panel and the second attachment frame, a foam layer is provided on a side of the back plate away from the display panel, and a third adhesive layer is provided between the display panel and the back plate.

6. The flexible display device according to claim 4, wherein the flexible display device further comprises an entire device frame, and outer sides of the first attachment frame and second attachment frame are attached to an inner surface of the entire device frame.

7. A flexible display device, comprising:
a display panel having a front side and a back side opposite to each other;
an attachment frame comprising a first attachment frame disposed on a peripheral edge of the front side of the display panel; and
a cover window structure fixedly disposed on a side of the first attachment frame away from the display panel, and connected to the display panel through the first attachment frame, wherein the cover window structure, the display panel, and the first attachment frame enclose a cavity therebetween, wherein a touch panel and a polarizer are stacked in order from bottom to top between the display panel and the first attachment frame, a first adhesive layer is disposed between the display panel and the touch panel, and a second adhesive layer is disposed between the touch panel and the polarizer.

8. The flexible display device according to claim 7, wherein the cover window structure comprises a base layer, and the base layer is made of a material comprising at least one of a cycloolefin polymer and a polyterephthalate plastic.

9. The flexible display device according to claim 8, wherein the cover window structure further comprises a hardened layer disposed on the base layer.

10. The flexible display device according to claim 7, wherein a light adjustment layer is provided on the front side of the display panel, and the light adjustment layer is located in the cavity.

11. The flexible display device according to claim 7, wherein the cover window structure and the first attachment frame are fixedly connected by bonding with as adhesive layer or by mechanical connection.

12. The flexible display device according to claim 11, wherein the cover window structure and the first attachment frame are fixedly connected by rivet fixing or screw connection.

13. The flexible display device according to claim 7, wherein a width of the first attachment frame is 0.1 mm-20 mm, and a thickness of the first attachment frame is 0.05 mm-5 mm.

14. The flexible display device according to claim 7, wherein a thickness of the cover window structure is 0.05 mm-0.1 mm.

15. The flexible display device according to claim 7, wherein the attachment frame further comprises a second attachment frame, the second attachment frame is disposed on a peripheral edge of the back side of the display panel to fix the display panel, and the second attachment frame and the display panel are fixedly connected by bonding with an adhesive layer.

16. The flexible display device according to claim 15, wherein a back plate is provided between the display panel and the second attachment frame, a foam layer is provided on a side of the back plate away from the display panel, and a third adhesive layer is provided between the display panel and the back plate.

17. The flexible display device according to claim 15, wherein the flexible display device further comprises an entire device frame, and outer sides of the first attachment frame and second attachment frame are attached to an inner surface of the entire device frame.

18. The flexible display device according to claim 17, wherein the first attachment frame and the second attachment frame are integrally formed with the entire device frame.

* * * * *